United States Patent
Gong et al.

(10) Patent No.: US 11,145,814 B2
(45) Date of Patent: Oct. 12, 2021

(54) PHASE CHANGE MEMORY WITH CONDUCTIVE BRIDGE FILAMENT

(71) Applicant: INTERNATIONAL BUSINESS MACHINES CORPORATION, Armonk, NY (US)

(72) Inventors: Nanbo Gong, White Plains, NY (US); Takashi Ando, Tuckahoe, NY (US); Guy M. Cohen, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 16/538,262

(22) Filed: Aug. 12, 2019

(65) Prior Publication Data

US 2021/0050518 A1    Feb. 18, 2021

(51) Int. Cl.
*H01L 45/00*    (2006.01)
*H01L 27/24*    (2006.01)

(52) U.S. Cl.
CPC ...... *H01L 45/1286* (2013.01); *H01L 27/2427* (2013.01); *H01L 45/06* (2013.01); *H01L 45/1233* (2013.01); *H01L 45/1246* (2013.01); *H01L 45/1608* (2013.01); *H01L 45/144* (2013.01)

(58) Field of Classification Search
CPC . H01L 27/2427; H01L 27/2463; H01L 45/06; H01L 45/1233; H01L 45/1246; H01L 45/126; H01L 45/1286; H01L 45/144; H01L 45/1608; H01L 45/1625; H01L 45/1641; H01L 45/1683; H01L 45/1691
See application file for complete search history.

(56) References Cited

U.S. PATENT DOCUMENTS

| | | | |
|---|---|---|---|
| 6,667,902 B2 | 12/2003 | Peng | |
| 7,560,721 B1 | 7/2009 | Breitwisch et al. | |
| 7,851,323 B2 * | 12/2010 | Breitwisch | H01L 45/141 438/382 |
| 8,124,954 B2 | 2/2012 | Wang et al. | |
| 8,385,100 B2 | 2/2013 | Kau et al. | |
| 8,824,188 B2 * | 9/2014 | Lee | G11C 13/0007 365/148 |
| 9,570,678 B1 | 2/2017 | Jo et al. | |
| 10,665,781 B2 * | 5/2020 | Karpov | H01L 45/1666 |
| 2012/0287706 A1 * | 11/2012 | Lung | H01L 45/1233 365/163 |

(Continued)

OTHER PUBLICATIONS

Burr et al., "Phase change memory technology", Journal of Vacuum Science & Technology B. vol. 28, Issue 2. pp. 1-40. Mar. 19, 2010. pp. 223-262.

(Continued)

*Primary Examiner* — Stephen W Smoot
(74) *Attorney, Agent, or Firm* — Tutunjian & Bitetto, P.C.; Randall Bluestone

(57) ABSTRACT

Methods and structures for fabricating a semiconductor device that includes a reduced programming current phase change memory (PCM) are provided. The method includes forming a bottom electrode. The method further includes forming a PCM and forming a conductive bridge filament in a dielectric to serve as a heater for the PCM. The method also includes forming a top electrode.

17 Claims, 9 Drawing Sheets

(56) References Cited

U.S. PATENT DOCUMENTS

| | | | |
|---|---|---|---|
| 2014/0015143 A1* | 1/2014 | Liu | H01L 43/02 |
| | | | 257/774 |
| 2014/0264243 A1 | 9/2014 | Hong et al. | |
| 2018/0123034 A1* | 5/2018 | Ando | H01L 45/146 |
| 2020/0161372 A1* | 5/2020 | Beckmann | H01L 45/1253 |

OTHER PUBLICATIONS

Gong et al., "Signal and noise extraction from analog memory elements for neuromorphic computing", Nature Communications. vol. 9, Issue 1. May 29, 2018. pp. 1-8.

Happ et al., "Novel One-Mask Self-Heating Pillar Phase Change Memory", 2006 Symposium on VLSI Technology. Digest of Technical Papers. Jun. 13, 2006. pp. 120-121.

Li et al., "Electrothermal Modeling and Design Strategies for Multibit Phase-Change Memory", IEEE Transactions on Electron Devices. vol. 59, No. 12. Dec. 2012. pp. 3561-3567.

\* cited by examiner

400

```
┌─────────────────────────────────────────────────────────────┐
│  Conformally depositing a dielectric layer on a structure   │
│  including a conductive material formed in a recess of a    │
│  substrate                                                  │
│                          410                                │
└─────────────────────────────────────────────────────────────┘
                              │
                              ▼
┌─────────────────────────────────────────────────────────────┐
│         Patterning gaps over the conductive material        │
│                          420                                │
└─────────────────────────────────────────────────────────────┘
                              │
                              ▼
┌─────────────────────────────────────────────────────────────┐
│  Depositing a Conductive Bridge Filament Dielectric Layer   │
│  in the recesses                                            │
│                          430                                │
└─────────────────────────────────────────────────────────────┘
                              │
                              ▼
┌─────────────────────────────────────────────────────────────┐
│             Forming PCM device stack pillars on the         │
│  structure above the Conductive Bridge Filament Dielectric  │
│  Layer                                                      │
│                          440                                │
└─────────────────────────────────────────────────────────────┘
                              │
                              ▼
┌─────────────────────────────────────────────────────────────┐
│      Forming a spacer around the PCM and Conductive         │
│         Bridge Filament Dielectric Layer pillars            │
│                          450                                │
└─────────────────────────────────────────────────────────────┘
                              │
                              ▼
┌─────────────────────────────────────────────────────────────┐
│            Form contacts to connect top electrode           │
│                          460                                │
└─────────────────────────────────────────────────────────────┘
```

FIG. 9

PHASE CHANGE MEMORY WITH CONDUCTIVE BRIDGE FILAMENT

BACKGROUND

The present invention generally relates to phase change memory (PCM), and more particularly to lowering the programming current of PCM devices.

Phase-change memory (PCM) can be a type of non-volatile random-access memory. PCMs can be used to store data, such as bits representing binary states.

SUMMARY

In accordance with an embodiment of the present invention, a method for fabricating a semiconductor device that includes a reduced programming current phase change memory (PCM) is provided. The method includes forming a bottom electrode. The method further includes forming a PCM and forming a conductive bridge filament to serve as a heater for the PCM. The method also includes forming a top electrode.

In accordance with an embodiment of the present invention, a semiconductor device that includes a reduced programming current phase change memory (PCM) is provided. The semiconductor device includes a bottom electrode, and a conductive bridge filament positioned on the bottom electrode. The semiconductor device also includes a PCM, and a top electrode.

In accordance with an embodiment of the present invention, a semiconductor device that includes a reduced programming current phase change memory (PCM) is provided. The semiconductor device includes a bottom contact, and a reduced size bottom electrode. A conductive bridge filament in a silicon oxide (SiO$_2$) dielectric positioned on the reduced size bottom electrode. The semiconductor device also includes a PCM and a top electrode. The reduced size bottom electrode is connected to the PCM by the conductive bridge filament.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 9 is a flow diagram showing a method of forming a structure that includes a reduced programming current phase change memory with a conductive bridge filament, in accordance with an embodiment of the present invention.

DETAILED DESCRIPTION

Figure 1:
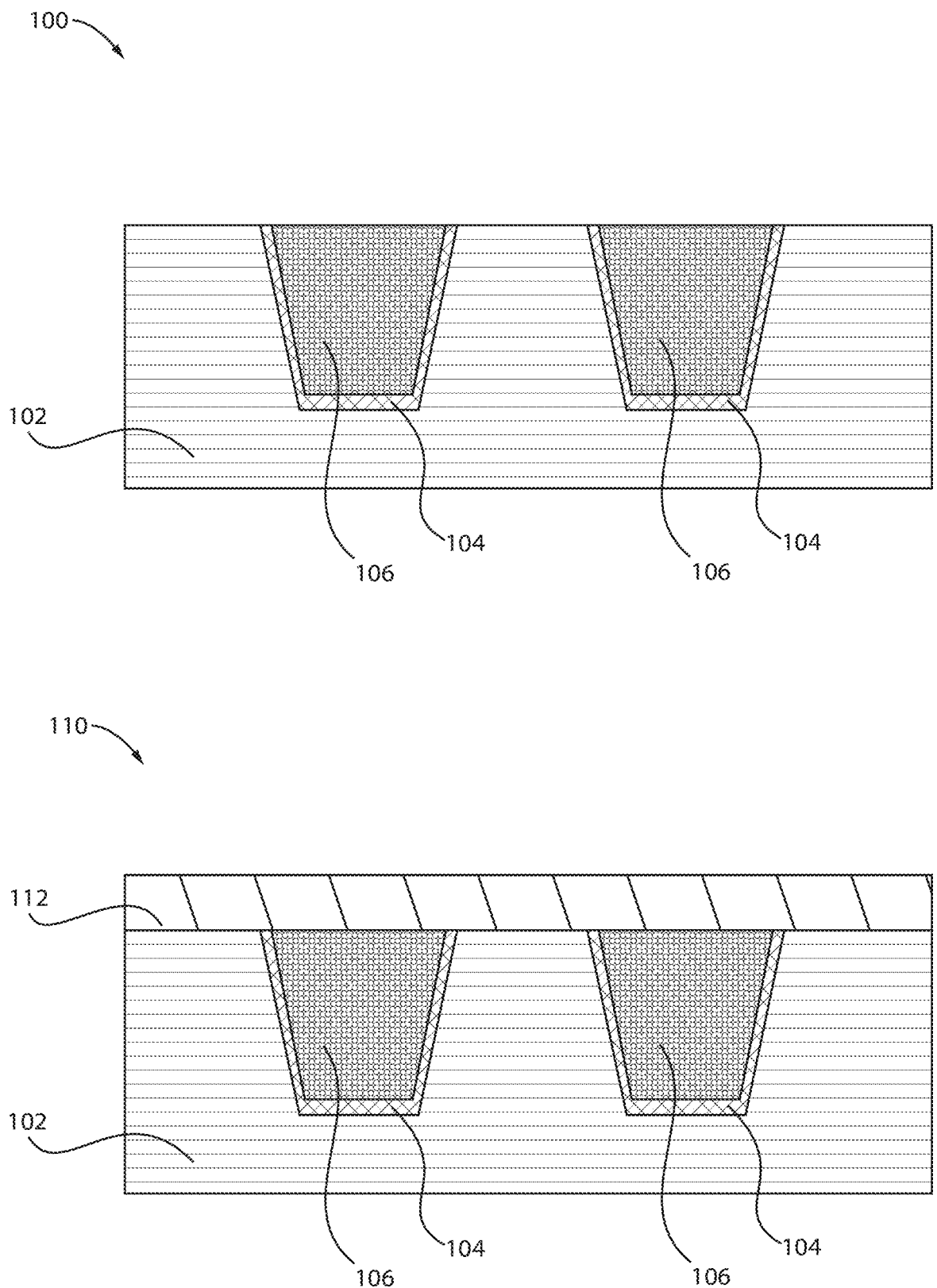
FIG. 1 illustrates cross-sectional views showing a structure that includes a dielectric substrate with conductive material deposits and conformal deposition of a dielectric on the structure, in accordance with an embodiment of the present invention.

Embodiments of the present invention relate generally to methods and structures for using a conductive bridge filament to reduce programming current of phase change memory (PCM). The PCM can be based on phase change materials, such as ternary compounds of germanium (Ge), antimony (Sb), and tellurium (Te) (collectively GST), with composition Ge$_2$Sb$_2$Te$_5$, GeTe, Sb$_2$Te$_3$, etc. A conductive bridge filament, for example, silicon oxide (SiO$_2$), or other (for example, a conductive bridging random access memory (CBRAM)) dielectric such as, for example, amorphous silicon (a-Si), amorphous silicon germanium alloy (aSiGe), hafnium dioxide (HfO$_2$), aluminum oxide (Al$_2$O$_3$), etc., is introduced to serve as the bottom heater of a PCM cell. The structure uses a filament to serve as the bottom electrode to heat the PCM material. Because of single polarity for both set and reset programming pulses to the PCM, the filament (for example, SiO$_2$) will remain once formed.

Embodiments of the present invention also relate generally to a conductive bridge filament PCM. PCM devices need a high reset current to generate enough heat to melt the phase change material, and consequently consumes significant amounts of power. By reducing the level of reset current needed to reset the PCM, the example embodiments reduce the amount of power consumed by the PCM device.

Exemplary applications and/or uses to which the present invention can be applied include, but are not limited to: reducing effective heater size to enhance heating efficiency and reduce reset current and reducing a critical dimension (CD) of the bottom electrode.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It should be noted that materials may be referred to only by their composition constituent, e.g., silicon, nitrogen, oxygen, carbon, hafnium, titanium, etc., without specifying a particular stoichiometry (e.g., SiGe, $SiO_2$, $Si_3N_4$, $HfO_2$, etc.) in recognition that the stoichiometry can vary based on formation processes, processing parameters, intentional non-stoichiometric fabrication, deposition tolerance, etc. Reference to only the composition constituents (e.g., SiO, SiN, TiN, etc.) is, therefore, intended to refer to all suitable stoichiometric ratios for the identified composition. In addition, other elements can be included in the compound and still function in accordance with the present principles. The compounds with additional elements will be referred to herein as alloys.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

FIGS. 1 to 7 illustrate an example embodiment of processes that may be implemented for reducing a reset current of PCM. The processes described with respect to FIGS. 1 to 7 achieve this by forming a structure that includes a conductive bridge filament and PCM and using the conductive bridge filament to reduce the reset current of PCM. The example embodiments use the conductive bridge filament to provide higher current potential than incumbent counterpart structures such as oxide resistive random access memory (RRAM) under similar operation voltage, thereby providing a benefit of sufficient reset current to PCM under lower operating voltage than the oxide RRAM. The conductive bridge filament uses metal cations.

Referring now to the drawings in which like numerals represent the same or similar elements and initially to FIG. 1, cross-sectional views showing a structure that includes a dielectric substrate with conductive material deposits and conformal deposition of a dielectric on the structure, in accordance with example embodiments.

As shown in FIG. 1, an incoming (for example, initial) structure 100 includes a substrate 102. The substrate 102 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides; other carbon-containing materials; organo-inorganic materials such as spin-on glasses and silsesquioxane-based materials; and diamond-like carbon (DLC, also known as amorphous hydrogenated carbon, a-C:H).

The substrate 102 may be formed by, for example, various methods such as spinning from solution, spraying from solution, chemical vapor deposition (CVD), plasma enhanced CVD (PECVD), sputter deposition, reactive sputter deposition, ion-beam deposition, and evaporation, etc.

Recesses are formed in the substrate 102. The recesses are covered with a barrier (or liner) layer 104 and then filled with a conductive material 106.

The barrier layer 104 is formed (for example, deposited) on the substrate 102 within the recesses. The barrier layer 104 can be selected from the group that includes nitrides (e.g., SiN), carbonitrides (e.g., SiCN, SiBCN, and SiOCN), organosilicate glass (OSG), oxides (e.g., fluorine doped silicon dioxide, carbon doped silicon dioxide, porous silicon dioxide, and porous carbon doped silicon dioxide), spin-on materials (e.g., spin-on organic polymeric dielectrics and spin-on silicon based polymeric dielectrics), etc.

In various example embodiments, the conductive material 106 can include one or more metals including copper (Cu), cobalt (Co), aluminum (Al), platinum (Pt), gold (Au), tungsten (W), titanium (Ti), or any combination thereof. The metals can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 106 can be reduced by chemical-mechanical polishing (CMP) and/or etching. Therefore, the planarization process can be provided by CMP. Other planarization process can include grinding and polishing.

At stage 110, a conformal dielectric deposition (a first dielectric layer 112) is added to the structure. The first dielectric layer 112 can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed. The first dielectric layer 112 may be selected from the group consisting of silicon-containing materials such as SiN or other conformal dielectrics, etc.

Figure 2:
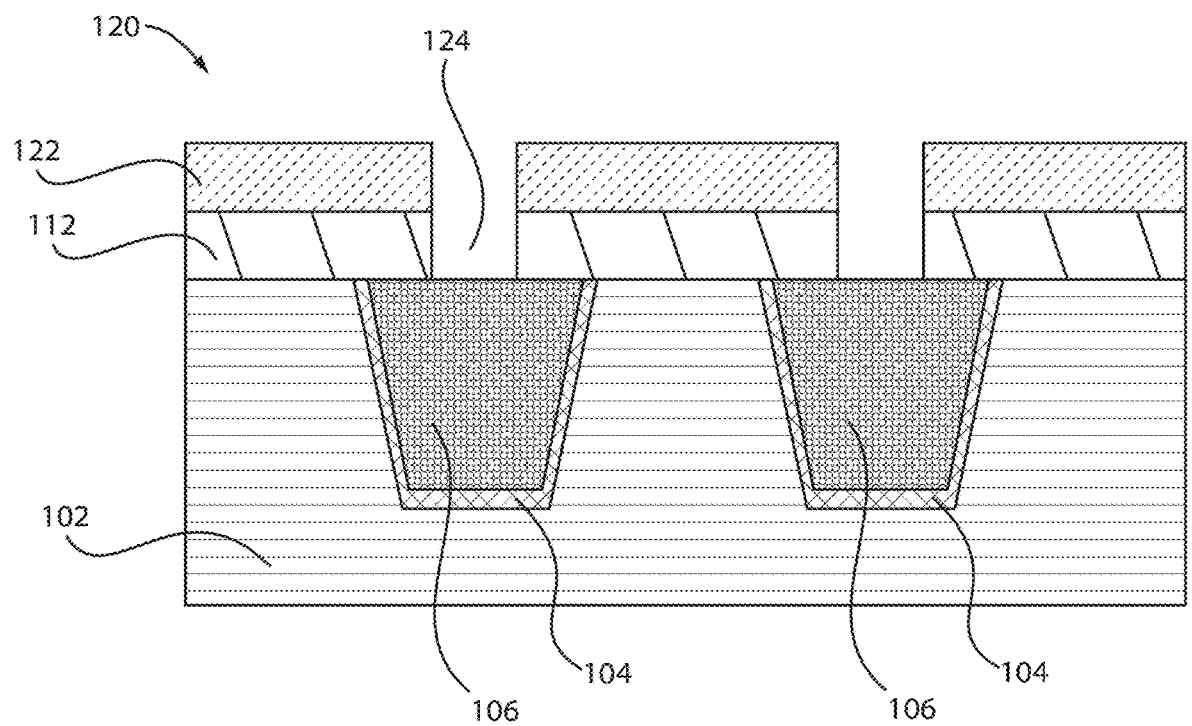
FIG. 2 illustrates cross-sectional views showing patterning of the structure of FIG. 1, in accordance with an embodiment of the present invention.
Figure 2:
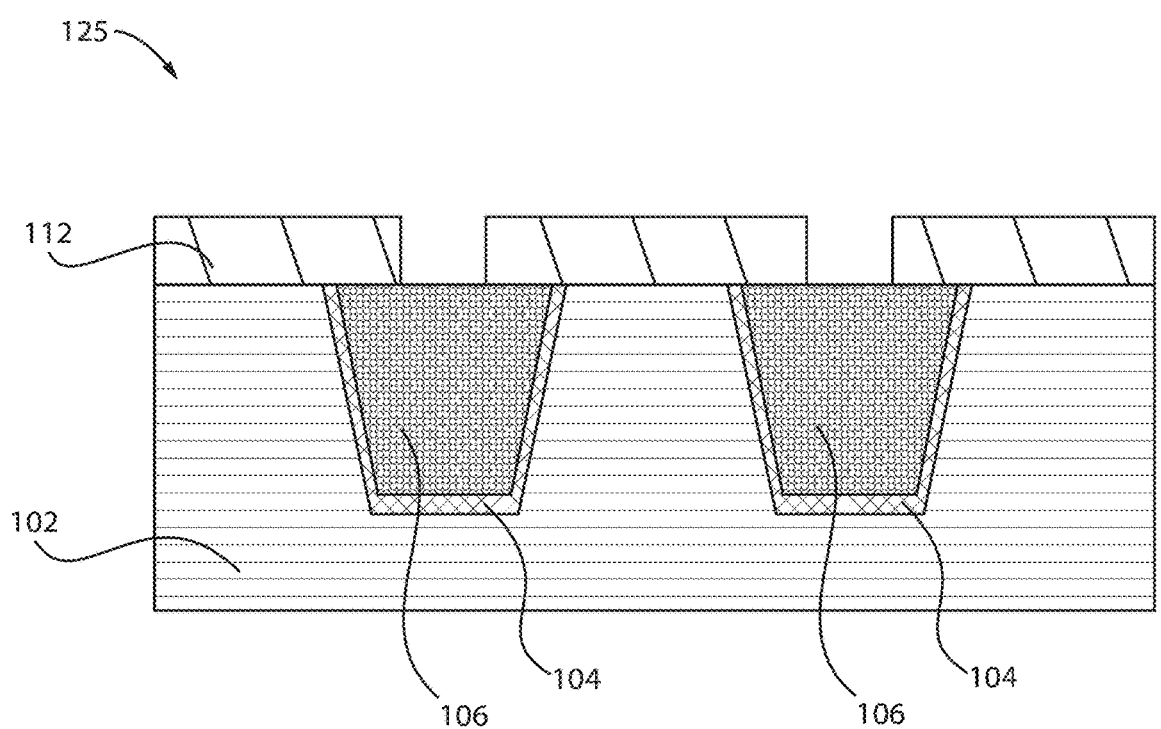

FIG. 2 illustrates cross-sectional views showing patterning of the structure of FIG. 1 (particularly from stage 110), in accordance with example embodiments.

As shown at stage 120, a mask 122 can be formed on the surface of the structure and then dielectric trenches 124 (or recesses, gaps, etc.) can be patterned into the structure (particularly, the first dielectric layer 112).

The mask 122 can be formed on a surface of the first dielectric layer 112. The mask 122 can include soft and/or hardmask materials and can be formed using deposition, photolithography and etching. In one embodiment, the mask 122 can be a hardmask. For example, the mask 122 can include a nitride-containing material, such as, e.g., a silicon nitride material (e.g., SiN, a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof). However, the mask 122 can include any suitable dielectric material that can be deposited by, e.g., chemical vapor deposition (CVD) and related methods. Other compositions for the mask 122 include, but are not limited to, silicon oxides, silicon carbides, etc. Spin-on dielectrics that can be utilized as a material for the mask 122 can include, but are not limited to: silsequioxanes, siloxanes, and boron phosphate silicate glass (BPSG).

Dielectric trenches 124 are patterned into the first dielectric layer 112, exposing the conductive material 106 by patterning, for example, by applying reactive ion etching (RIE) (to exposed portions of the first dielectric layer 112 while) using the mask 122 stopping on the conductive material 106. At stage 125, the patterning mask 122 is thereafter removed (for example, stripped, etc.) leaving the first dielectric layer 112 with trenches 124.

Figure 3:
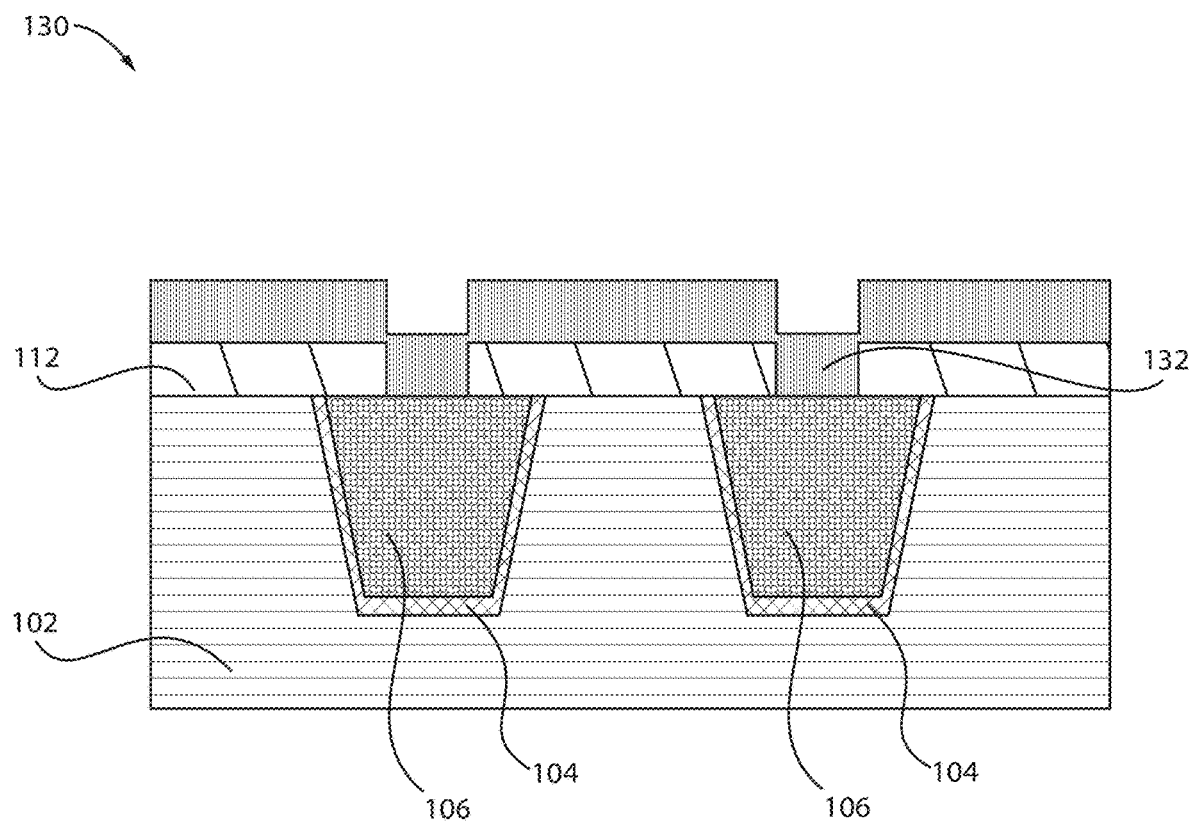
FIG. 3 illustrates cross-sectional views showing deposit and planarization of conductive bridge filament layer on the structure of FIG. 2, in accordance with an embodiment of the present invention.
Figure 3:
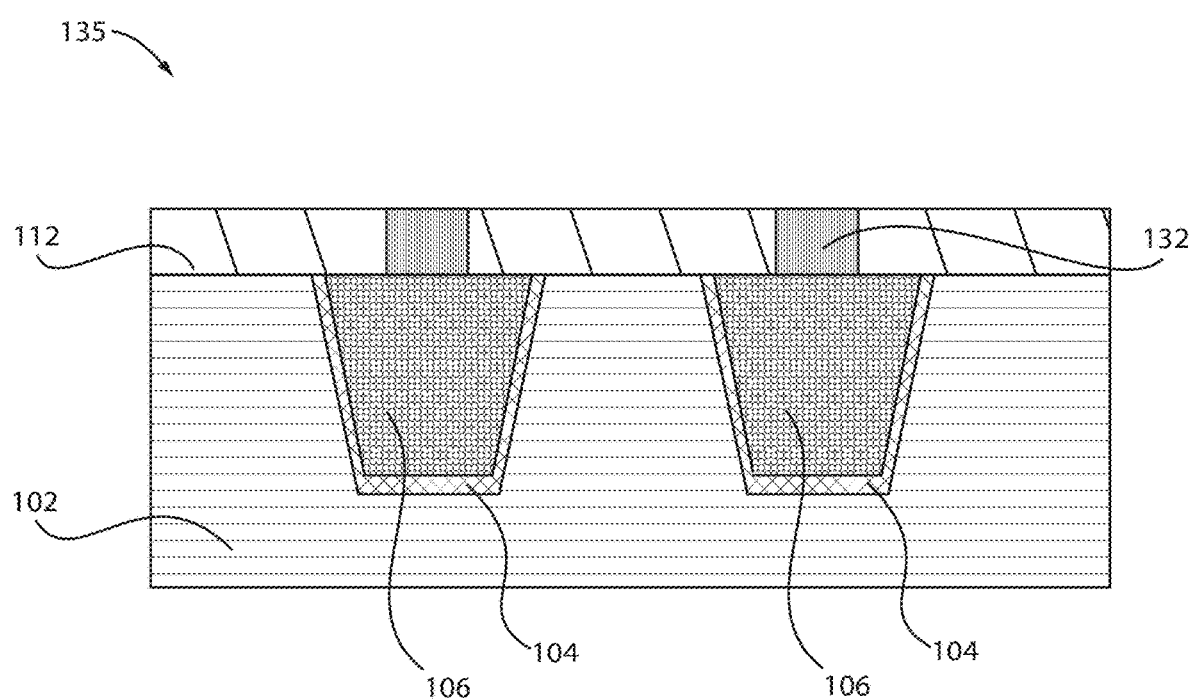

FIG. 3 illustrates cross-sectional views showing deposit and planarization of conductive bridge filament layer on the structure of FIG. 2, in accordance with example embodiments.

As shown at stage 130, a conductive bridge filament layer 132 (for example, a dielectric, such as $SiO_2$) is added to the structure. The conductive bridge filament layer 132 be deposited by any suitable techniques, such as, e.g., physical vapor deposition (PVD), ALD, CVD, metal-organic CVD (MOCVD), thermal oxidation, combinations thereof, or other suitable techniques. The conductive bridge filament layer 132 can include $SiO_2$, or other CBRAM dielectric, such as amorphous silicon (a-Si), amorphous silicon germanium alloy (aSiGe), hafnium dioxide ($HfO_2$), aluminum oxide ($Al_2O_3$), etc. The conductive bridge filament layer 132 fills the dielectric trenches 124 patterned into the first dielectric layer 112 and may cover the exposed surface of the first dielectric layer 112.

At stage 135, the conductive bridge filament layer 132 is reduced via chemical-mechanical polishing (CMP) and/or etching, stopping on conformal dielectrics (for example, the first dielectric layer 112). Therefore, the planarization process can be provided by CMP. Other planarization processes can include grinding and polishing, etc. The planarization process results in conductive bridge filament deposits 132 in the trenches of the first dielectric layer 112 above the conductive material 106, substantially level with the top of the first dielectric layer 112, while the rest of the conductive bridge filament layer 132 is removed from the planarized upper surface of the structure (for example, from the first dielectric layer 112).

Figure 4:
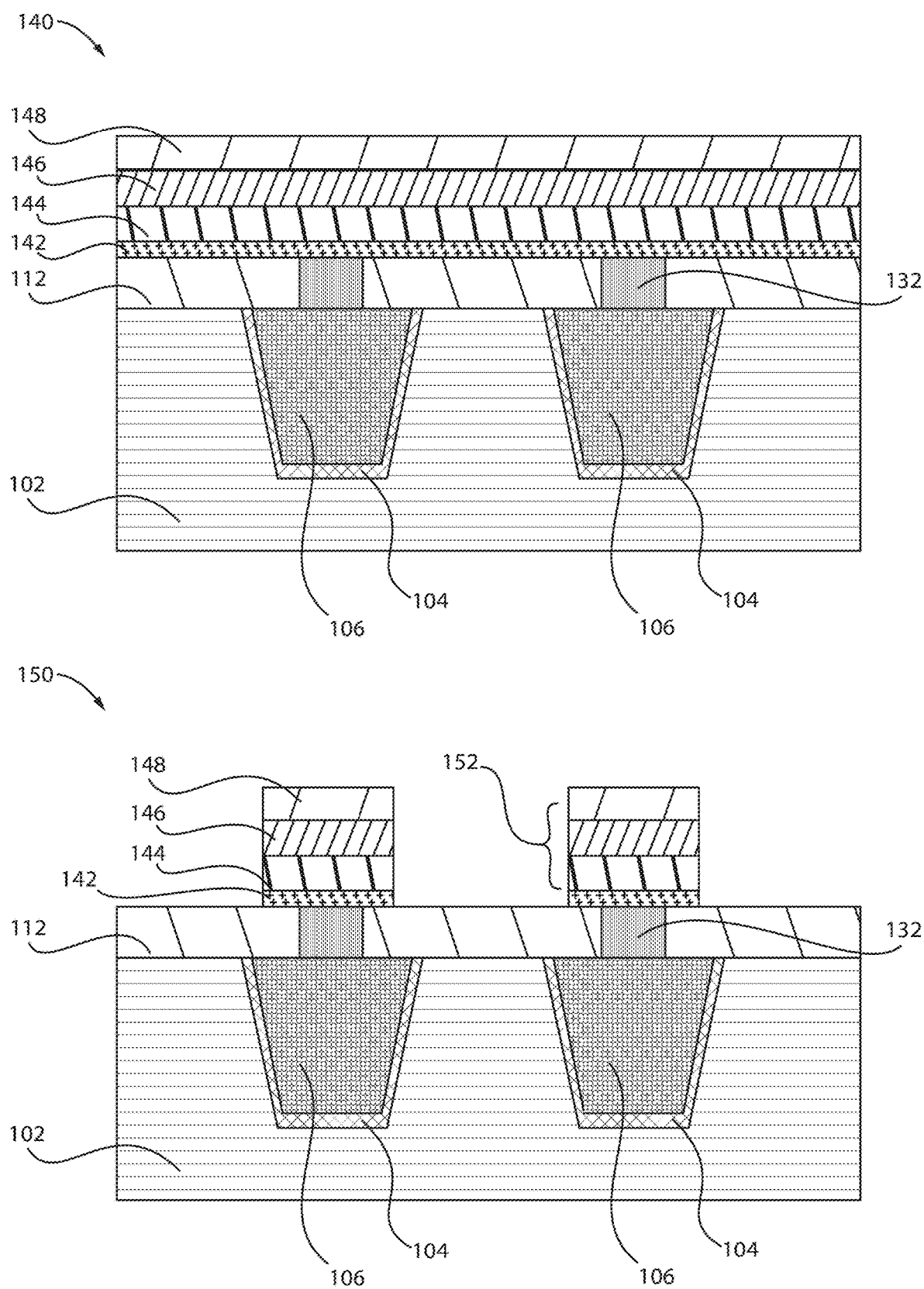
FIG. 4 illustrates cross-sectional views showing deposit and pillar patterning of phase change memory (PCM) on the structure of FIG. 3, in accordance with an embodiment of the present invention.

FIG. 4 illustrates cross-sectional views showing deposit and pillar patterning of phase change memory (PCM) on the structure of FIG. 3, in accordance with example embodiments.

As shown at stage 140, a PCM device stack is deposited on the structure. The PCM layer can include chalcogenide-based phase change materials (such as, for example, GST or any other combination that could show phase change between amorphous and crystalline The PCM device stack includes a PCM layer 142, which is deposited on the upper surface of the structure (including over the first dielectric layer 112 and the conductive bridge filament layer 132), a top electrode layer 144, which is formed on the PCM layer 142, a first hardmask layer 146, which is formed on the top electrode layer 144, and a second hardmask layer 148, which is formed on the first hardmask layer 146. The PCM layer 142 covers the (upper surface of the) first dielectric layer 112 and the conductive bridge filament layer 132. The PCM layer 142 can include chalcogenides such as germanium antimony telluride (for example, $Ge_2Sb_2Te_5$ or GST-225), etc.

Top electrode layer 144 can include a conductive material that would not react with the PCM material. Accordingly, materials such as copper (Cu), silver (Ag), and gold (Au) should not be used for (or included in) the top electrode layer 144. In some embodiments, the top electrode 144 can include nitrides such as titanium nitride (TiN), tantalum nitride (TaN), Ta or ruthenium (Ru). In a preferred embodiment, the top electrode 144 is TiN. Tungsten (W) based alloys can also be used.

In various example embodiments, the second hardmask layer 148 can be a nitride, for example, a silicon nitride (SiN), an oxynitride, for example, silicon oxynitride (SiON), or a combination thereof. In a preferred embodiment, the first hardmask layer 146 can be tantalum nitride (TaN), for example, TaN. In an example embodiment, the hardmask layers are chosen to enable RIE of GST materials with a good selectivity.

In one or more embodiments, the first hardmask layer 146 can have a thickness, for example, in the range of about 20 nm to about 100 nm, or in the range of about 35 nm to about 75 nm, or in the range of about 45 nm to about 55 nm, although other thicknesses are contemplated.

In various example embodiments, the second hardmask layer 148 can be a nitride, for example, a silicon nitride (SiN), an oxynitride, for example, silicon oxynitride (SiON), or a combination thereof. In a preferred embodiment, the second hardmask layer 148 can be silicon nitride (SiN), for example, $Si_3N_4$.

In one or more embodiments, the second hardmask layer 148 can have a thickness in the range of about, for example, 20 nm to about 100 nm, or in the range of about 35 nm to about 75 nm, or in the range of about 45 nm to about 55 nm, although other thicknesses are contemplated.

At stage 150, subsequent to addition of the PCM device stack layers (for example, PCM layer 142, top electrode layer 144, first hardmask layer 146, and second hardmask layer 148), the PCM device stack layers are patterned using the hardmask layers (first hardmask layer 146, and second hardmask layer 148) to form pillars 152. For example, PCM device pillar patterning can be implemented using photolithographic patterning and etching of the layers, etc.

The patterning forms PCM device pillars 152 that are substantially disposed over the conductive bridge filament deposits 132 in the recesses of the first dielectric layer 112. In an example embodiment, the PCM device pillars 152 also cover a portion of the top surface of the first dielectric layer 112 adjacent to (or around, on each side of each, etc.) conductive bridge filament deposits 132.

Figure 5:
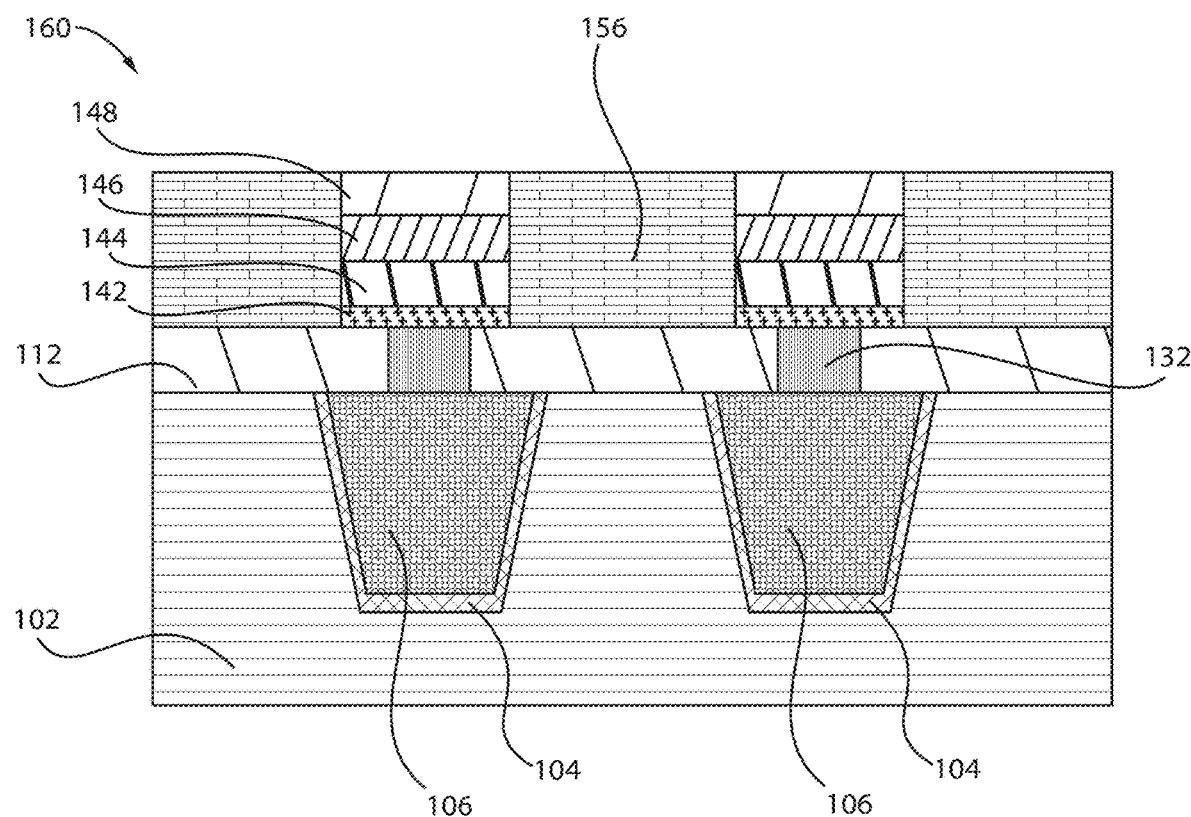
FIG. 5 is a cross-sectional view showing formation of a spacer around PCM and conductive bridge filament pillars, in accordance with an embodiment of the present invention.

FIG. 5 is a cross-sectional view showing formation of a spacer around PCM and CBRAM pillars, in accordance with example embodiments.

At stage 155, a spacer layer 156 (for example, a dielectric layer) is deposited. In various example embodiments, a SiN encapsulation 156 takes place. The spacer layer 156 encapsulates the (for example, first and second) PCM and conductive bridge filament pillars 152. Although a particular number of PCM and conductive bridge filament pillars 152 are shown by way of illustration, it should be appreciated that the structures can include any number of PCM and conductive bridge filament pillars 152 (for example, more than two PCM and conductive bridge filament pillars 152).

Figure 6:
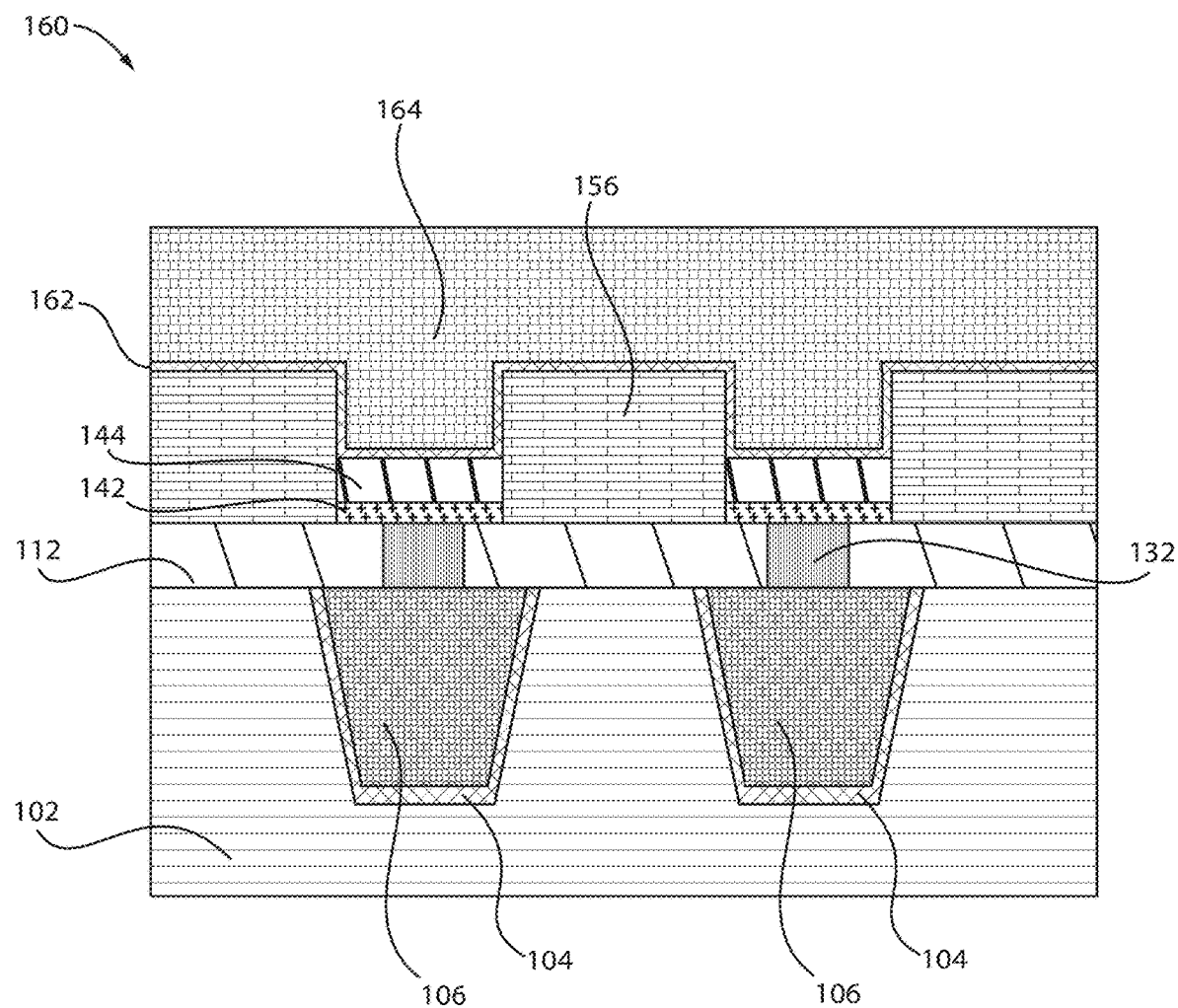
FIG. 6 is a cross-sectional view showing patterning of conductive lines to connect top electrode(s), in accordance with an embodiment of the present invention.

FIG. 6 is a cross-sectional view showing patterning of conductive lines to connect top electrode(s), in accordance example embodiments.

In various example embodiments (at stage 160), (some or all of) the hardmask layers (for example, first hardmask layer 146, and second hardmask layer 148) are removed (for example, stripped, etched, etc.) by a selective process that stops on the spacer layer 156. The SiN layer 90 can be selectively etched by, e.g., RIE. The etch results in a recess of the surface of the structure between the spacers 156 above the PCM and conductive bridge filament pillars 152.

A liner (or barrier) layer 162 can be deposited over the top surface of the structure, including covering the PCM and conductive bridge filament pillars 152 and the dielectric layer 156 (for example, sidewall spacer). A layer of conductive material can be deposited on the structure, including filling the recesses between the spacers 156 above the PCM and conductive bridge filament pillars 152.

In various example embodiments, the top conductive material 164 can be metals including copper (Cu), cobalt (Co), aluminum (Al), tungsten (W), titanium (Ti), or any combination thereof. The metals can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the top conductive material 164 can be patterned into lines to connect a top electrode 164. The height of the top conductive material 164 can be reduced by chemical-mechanical polishing (CMP) and/or etching. Therefore, the planarization process can be provided by CMP. Other planarization process can include grinding and polishing.

Figure 7:
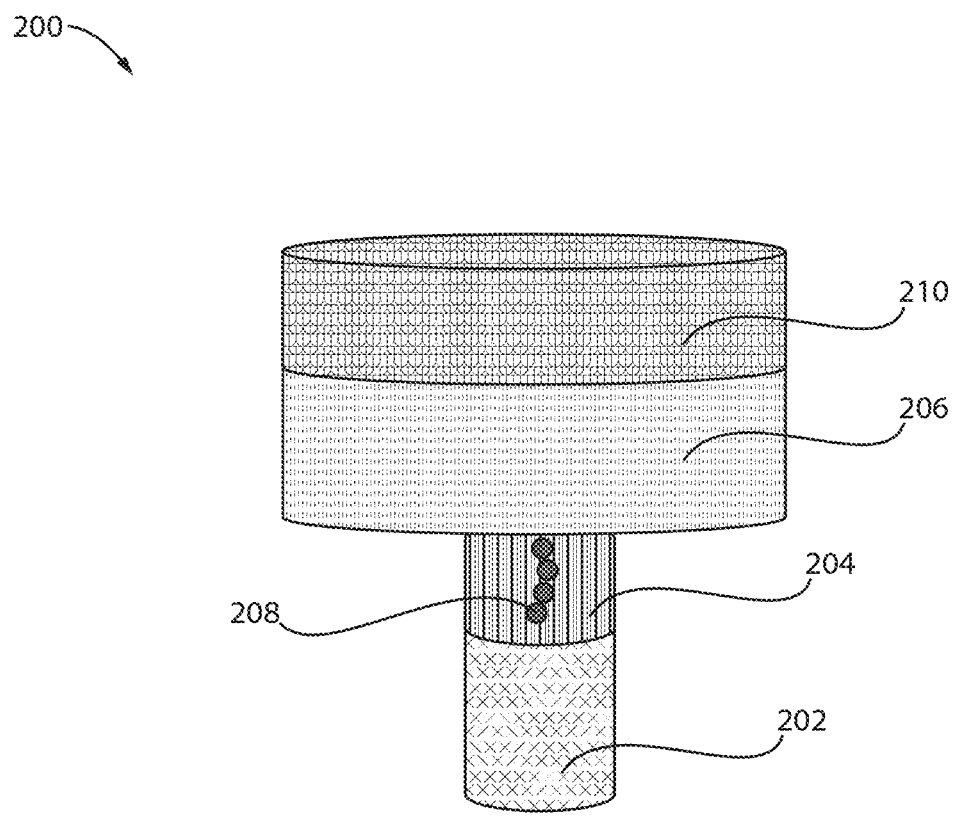
FIG. 7 is a perspective view showing a top electrode and PCM, with reduced size bottom electrode and conductive bridge filament, in accordance with an embodiment of the present invention.

FIG. 7 is a perspective view of a PCM device 200 showing a top electrode and PCM layer with a reduced size bottom electrode and conductive bridge filament, in accordance with example embodiments.

PCM device 200 includes a bottom electrode 202 with a reduced size (compared to the PCM layer 206) based on the conductive bridge filament dielectric layers 204. PCM device 200 includes a larger top electrode 210 and PCM layer 206. The conductive bridge filament 208 forms in the conductive bridge filament dielectric layers 204. The structure uses a filament to serve as the bottom electrode to heat the PCM material. Because of single polarity for both set and reset programming pulses to the PCM the conductive bridge filament in the $SiO_2$ will remain once it is formed.

Phase change memory is known to need high reset current to generate enough heat to melt the phase change material, which consumes significant amounts of power. The example embodiments provide an increase in heating efficiency when compared to incumbent structures for PCM. The example embodiments allow use of a much smaller reset current (for example) to create an amorphous PCM region at the top (for example, "tip") of the filament. The amorphous region of PCM material blocks the tip of the filament thus placing the cell in high resistance state. The use of the filament as the effective electrode to the PCM material compared, by way of example, with a lithographically defined bottom electrode 202 leads to reduction in the reset current. The reduction in the current is approximately equal to the ratio in contact area formed by the bottom electrode to that formed by the conductive bridge filament. According to example embodiments, the reset current can be reduced from approximately 300 μA to less than 100 μA.

Figure 8:
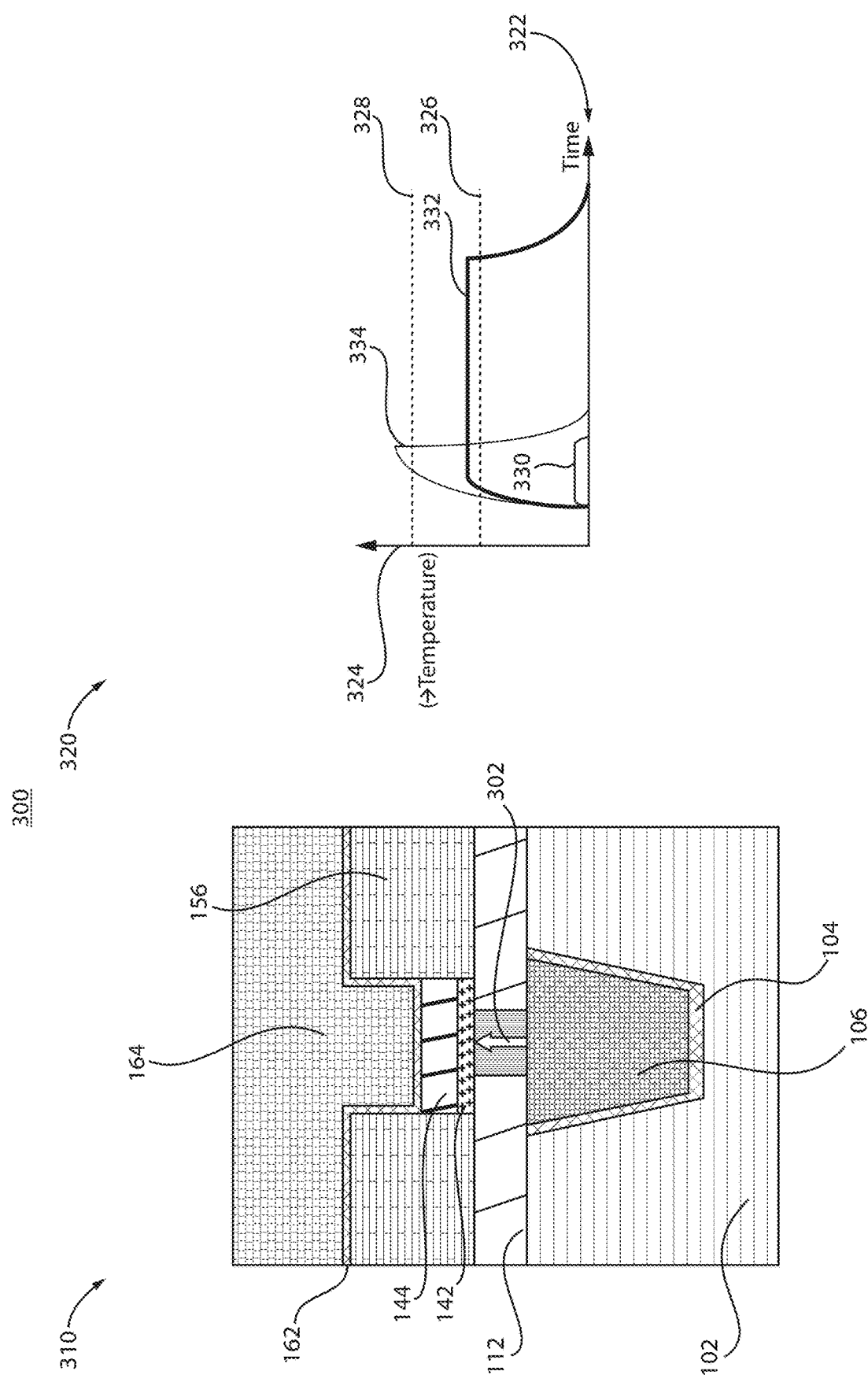
FIG. 8 is a cross-sectional view showing current direction in the conductive bridge filament with reduced programming current of PCM and a corresponding voltage/time graph of a read, set and reset programming pulses of PCM, in accordance with an embodiment of the present invention.

FIG. 8 illustrates a relationship 300 between current direction in the conductive bridge filament with reduced programming current of PCM (cross-sectional view 310) and a corresponding voltage/time graph 320 of read, SET, and RESET pulses of PCM, in accordance with an embodiment of the present invention.

As shown in 310, a cross-sectional view of the PCM device structure 310 includes a substrate 102, barrier layer 104, bottom contacts (for example conductive material 106), a bottom electrode 106, first dielectric layer 112, a conductive bridge filament 132, and a current direction 302 in the conductive bridge filament with reduced programming current of PCM. The PCM device structure 310 also includes spacers 156 with a recess in which a PCM 142 is positioned on the conductive bridge filament 132 and a top electrode 144 is positioned on the PCM 142. A barrier layer is formed over the spacers 156 and top electrode 144. A top contact 164 is formed (for example, in a planarized manner) over the barrier layer, including filling the rest of the recess above the top electrode 144. The top contact 164 can be formed in a planarized manner (for example, via deposit and CMP). The structure thus formed includes a PCM cell with a reduced size bottom electrode 106.

Heating efficiency in the PCM cell is affected by the size of bottom electrode 106. By reducing the size of bottom electrode 106, the current density is enhanced and generates heat more efficiently. The bottom electrode 106 may be of a material that would not "contribute" metal ions (cations) to form the filament. However, bottom electrodes of metal-nitride such as TiN or TaN are not known to provide metal ions for the forming the filament. A filament formed of oxygen vacancies can still form, however, these are covered by prior art. In example embodiments, a thin layer (a supply layer of "contributing metals") such as copper (Cu) or silver (Ag) can be deposited over the bottom electrode 106 or inserted in the middle of the conductive bridge filament dielectric layer. Alternatively, the conductive bridge filament dielectric layer can be doped with the contributing metal.

By using a conductive bridge filament, the size of bottom electrode 106 is effectively reduced to the size of the filament cross-section, which can be a few atoms wide. This allows the device to reduce the reset current by at least 2 orders.

As shown in voltage (y-axis) 324 to time (x-axis) 322 graph 320, a RESET 334 and SET 332 pulse of PCM have same direction but different pulse shape. A read pulse 330 is also illustrated. Temperature also increases with time. For reset (set) operation, the example embodiments use the filament to serve as the conducting bottom electrode 308 of the PCM. Due to reset 334 and set 332 operations of PCM having the same current direction 302, the filament of RRAM remains once the filament is formed (for example, the filament will not be reset).

In example embodiments, a conductive bridge filament dielectric (for example, $SiO_2$, or other dielectric such as, a-Si, aSiGe, $HfO_2$, $Al_2O_3$ etc.) is introduced to serve as the bottom heater of the PCM cell. The PCM in this structure has a the critical dimension that is larger than the size of the conductive bridge filament. The PCM can be a mushroom cell or pillar cell.

PCM device structure 310 uses filament to serve as the bottom electrode to heat the PCM material. The conductive bridge filament (for example, $SiO_2$) will remain once formed because of single polarity to give both set and reset programming pulse to the PCM.

This PCM and conductive bridge filament structure reduces operation voltages by significantly enhancing heating efficiency. The PCM and CBRAM structure is also suitable for scaling down the effective heater size to sub-lithographic dimensions (for example, <10 nm). Scaling the bottom electrode reduces programming current of PCM effectively. Reducing the critical dimension (CD) of the bottom electrode reduces the reset current of the PCM.

FIG. 9 is a flow diagram showing a method of forming a structure that includes a reduced programming current phase change memory with a conductive bridge filament, in accordance with an example embodiment.

In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

At block 410, a dielectric layer is conformally deposited on a structure. The structure includes conductive material (for example, Cu or other suitable conductive material) formed (for example deposited) in recesses of a substrate. The structure also includes a barrier layer formed (also in the recesses) between the conductive material and the substrate.

At block 420, gaps are patterned in the dielectric layer over the conductive material deposits. The gaps can be patterned, for example, using a hardmask and selective etching stopping on the conductive material. The hardmask can then be removed, leaving the dielectric layer with gaps over the conductive material deposits At block 430, a conductive bridge filament dielectric layer is deposited in the gaps (or recesses). The conductive bridge filament dielectric layer, for example $SiO_2$ or other suitable conformal dielectric, can be deposited by PVD.

At block 440, PCM device stack pillars are formed on the structure above the CBRAM dielectric. The PCM device stack pillars and the deposited conductive bridge filament dielectric layer form PCM and conductive bridge filament pillars. The PCM device stack pillars can include one or more hardmasks (for example, SiN and TaN hardmasks, etc.), a top electrode and a PCM layer.

At block 450, spacers are formed around the PCM and conductive bridge filament pillars. The spacers are formed over the dielectric layer and to the sides of the PCM and conductive bridge filament pillars. The conductive bridge filament can have a critical dimension that is smaller than the size of the PCM. In example embodiments, the spacers can be formed around the PCM pillar (in the instance of a mushroom structure), and can also be formed around both PCM and conductive bridge filament pillar if the PCM is a pillar structure. In both instances, the CD of the bottom electrode determines the reset current of PCM.

At block 460, contacts to connect the top electrode are patterned. The contacts can be conductive material, such as, for example, copper lines. With the device thus formed, for reset (set) operation, the conductive bridge filament serves as the conducting bottom electrode of the PCM. The conductive bridge filament can have a sub-lithographic dimension and form a contact to the PCM. In some instances, filament formation may use (for example, need) a higher voltage than the voltage used for PCM device operations after the filament is formed. By adjusting fabrication conditions the CBRAM material properties and/or thickness the forming voltage can be tuned to be within the PCM device operation voltage. For example, a thinner CBRAM dielectric would result in a lower filament formation voltage. Because reset and set operations of PCM has the same current direction, the filament of RRAM remains after it is formed.

The filament can form a contact to the PCM with a size less than 10 nm. The conductive bridge filament can be formed in a low resistance state (LRS) with for example, a transistor controlled current of approximately 100 uA. The conductive bridge filament can formed without switch back and consequently increased retention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of a method and device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device including a reduced programming current phase change memory (PCM), comprising:
    a bottom electrode;
    a deposited conductive bridge filament centrally positioned on the bottom electrode; and
    a pillar PCM device stack positioned on the conductive bridge filament, with the pillar PCM device stack including a PCM layer and a top electrode.

2. The semiconductor device of claim 1, wherein the conductive bridge filament is formed during operation of the semiconductor device.

3. The semiconductor device of claim 1, further comprising:
    spacers around the PCM device stack; and
    contacts connecting the top electrode.

4. The semiconductor device of claim 1, wherein a reset current of the PCM is less than a current of low resistance state of a conductive bridging random access memory (CBRAM) dielectric.

5. The semiconductor device of claim 1, wherein the PCM includes a critical dimension larger than a size of a conductive bridging random access memory (CBRAM) dielectric.

6. A semiconductor device including a reduced programming current phase change memory (PCM), comprising:
    a bottom contact;
    a reduced size bottom electrode;
    a conductive bridge filament in a silicon oxide ($SiO_2$) dielectric positioned on the reduced size bottom electrode;
    a PCM, wherein the reduced size bottom electrode is connected to the PCM by the conductive bridge filament, with a top planar surface of the reduced size bottom electrode having an area equal to a bottom planar surface of the $SiO_2$ dielectric and a smaller area than a bottom planar surface of the PCM; and
    a top electrode.

7. The semiconductor device of claim 6, wherein the conductive bridge filament is formed during operation of the semiconductor device.

8. The semiconductor device of claim 7, wherein the PCM is one of a mushroom cell and a pillar cell.

9. The semiconductor device of claim 8, wherein the PCM includes a critical dimension larger than a size of a conductive bridging random access memory (CBRAM) dielectric.

10. The semiconductor device of claim 7, wherein a reset current of the PCM is less than a current of low resistance state of a conductive bridging random access memory (CBRAM) dielectric.

11. The semiconductor device of claim 6, further comprising:
    spacers around the PCM; and
    contacts connecting the top electrode.

12. A semiconductor device including a reduced programming current phase change memory (PCM), comprising:
    a bottom electrode;
    a deposited conductive bridge filament centrally positioned on the bottom electrode; and
    a PCM device stack, including a PCM layer and a top electrode, positioned on the conductive bridge filament, with spacers around the PCM device stack.

13. The semiconductor device of claim 12, wherein the conductive bridge filament is formed during operation of the semiconductor device.

14. The semiconductor device of claim 13, wherein the PCM is one of a mushroom cell and a pillar cell.

15. The semiconductor device of claim 12, further comprising:
    contacts connecting the top electrode.

16. The semiconductor device of claim 12, wherein a reset current of the PCM is less than a current of low resistance state of a conductive bridging random access memory (CBRAM) dielectric.

17. The semiconductor device of claim 12, wherein the PCM includes a critical dimension larger than a size of a conductive bridging random access memory (CBRAM) dielectric.

* * * * *